US012588423B2

(12) United States Patent
Xing et al.

(10) Patent No.:     US 12,588,423 B2
(45) Date of Patent:     Mar. 24, 2026

(54) MAGNETORESISTIVE DEVICE, METHOD FOR CHANGING RESISTANCE STATE THEREOF, AND SYNAPSE LEARNING MODULE

(71) Applicant: INSTITUTE OF MICROELECTRONICS, CHINESE ACADEMY OF SCIENCES, Beijing (CN)

(72) Inventors: Guozhong Xing, Beijing (CN); Di Wang, Beijing (CN); Huai Lin, Beijing (CN); Long Liu, Beijing (CN); Yu Liu, Beijing (CN); Hangbing Lv, Beijing (CN); Changqing Xie, Beijing (CN); Ling Li, Beijing (CN); Ming Liu, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 625 days.

(21) Appl. No.: 18/003,913

(22) PCT Filed: Dec. 31, 2020

(86) PCT No.: PCT/CN2020/142194
§ 371 (c)(1),
(2) Date: Dec. 29, 2022

(87) PCT Pub. No.: WO2022/062263
PCT Pub. Date: Mar. 31, 2022

(65) Prior Publication Data
US 2023/0263070 A1     Aug. 17, 2023

(51) Int. Cl.
*H10N 50/10*          (2023.01)
*G11C 11/16*          (2006.01)
(Continued)

(52) U.S. Cl.
CPC ........... *H10N 50/10* (2023.02); *G11C 11/161* (2013.01); *H10B 61/22* (2023.02); *H10N 50/20* (2023.02); *H10N 50/85* (2023.02)

(58) Field of Classification Search
CPC ......... H10N 50/10–85; G11C 19/0841; G06N 3/06–063
See application file for complete search history.

(56) References Cited

U.S. PATENT DOCUMENTS 10,339,993 B1 *    7/2019    Schabes ................ G11C 11/161
10,720,572 B1 *    7/2020    Fitelson ................ H10N 50/85
(Continued)

FOREIGN PATENT DOCUMENTS

CN          104051611 A      9/2014
CN          112133343 A      12/2020
KR          102254252 B1 *   5/2021    ............. H01L 43/08

OTHER PUBLICATIONS

Chao et al, Compact Model of Dzyaloshinskii Domain Wall Motion-Based MTJ for Spin Neural Networks Jun. 2020, IEEE Transactions on Electronic Devices, vol. 67, No. 6, pp. 2621-2626 (Year: 2020).*
(Continued)

*Primary Examiner* — William B Partridge
*Assistant Examiner* — Alexander X Ramirez
(74) *Attorney, Agent, or Firm* — Kinney & Lange, P.A.

(57)          ABSTRACT

The present disclosure relates to a field of memory technical, and in particular to a magnetoresistive device, a method for changing a resistance state of the magnetoresistive device, and a synapse learning module. The magnetoresistive device includes a top electrode, a ferromagnetic reference layer, a tunneling layer, a ferromagnetic free layer, a spin-orbit coupling layer, and a bottom electrode that are arranged in sequence along a preset direction, where the spin-orbit coupling layer includes a first thickness region and a second thickness region distributed alternately, and a thickness of the first thickness region is different form a thickness of the second thickness region; and the ferromagnetic free layer includes a pinning region, and a position of the pinning region is in one-to-one correspondence with a position of the first thickness region.

9 Claims, 9 Drawing Sheets

(51) Int. Cl.
    *H10B 61/00*        (2023.01)
    *H10N 50/20*        (2023.01)
    *H10N 50/85*        (2023.01)

(56)             References Cited

U.S. PATENT DOCUMENTS

| | | | |
|---|---|---|---|
| 2001/0028068 A1* | 10/2001 | Sato | H10N 50/01 |
| | | | 257/E43.006 |
| 2017/0221577 A1* | 8/2017 | Choe | H10N 50/80 |
| 2019/0245137 A1 | 8/2019 | Choi et al. | |
| 2019/0312196 A1 | 10/2019 | Choi et al. | |
| 2020/0006628 A1* | 1/2020 | O'Brien | G11C 11/1675 |
| 2020/0403147 A1* | 12/2020 | Couet | H10N 52/00 |
| 2022/0068338 A1* | 3/2022 | Apalkov | G11C 11/18 |
| 2023/0006130 A1* | 1/2023 | Yang | G11C 11/161 |

OTHER PUBLICATIONS

First Chinese Office Action dated Apr. 26, 2022, for corresponding Chinese Application No. 202011637866.5.
International Search Report and Written Opinion dated Sep. 13, 2021, for corresponding PCT Application No. PCT/CN2020/142194.

* cited by examiner 101
102
103
107
104

105

106

201          202

104

105

1052   1051   1052   1051   1052

MAGNETORESISTIVE DEVICE, METHOD FOR CHANGING RESISTANCE STATE THEREOF, AND SYNAPSE LEARNING MODULE

CROSS-REFERENCE TO RELATED APPLICATION

This application is a Section 371 National Stage Application of International Application No. PCT/CN2020/142194, filed on Dec. 31, 2020, incorporated herein by reference in its entirety.

TECHNICAL FIELD

The present disclosure relates to a field of memory technology, and in particular to a magnetoresistive device, a method for changing a resistance state thereof, and a synapse learning module.

BACKGROUND

In recent decades, countries around the world have made great progress in the field of magnetic materials and spintronics, especially the research on magnetic random access memory (MRAM) based on spintronics has gradually become a hot spot. As one of the next-generation high-performance new memories, magnetic memory has many advantages such as non-volatility, high read and write speed, low power consumption, high density, and high endurance. At present, the mainstream research includes spin transfer torque MRAM (STT-MRAM) and spin orbit torque MRAM (SOT-MRAM). STT-MRAM uses a torque generated by a polarized current of a reference layer acting on a free layer to switch a magnetization direction of the free layer, and then characterize the change of a resistance value through the Tunneling Magnetoresistance Effect. However, a large current is required to generate enough torque to reverse the free layer during a writing process. SOT-MRAM uses the spin Hall effect of a spin-orbit coupling layer to induce an injection of a spin current in a vertical direction, that is, a current flowing in the spin-orbit coupling layer which has a strong spin-orbit coupling is converted into a spin current, and then, the spin current diffuses into a ferromagnetic layer and applies a torque to the magnetic moment of the ferromagnetic layer to reverse it. In addition, SOT-MRAM realizes the separation of reading and writing paths and has high reliability. However, conventional SOT-MRAM requires the application of an in-plane magnetic field to break the symmetry and ensure the magnetization reversal. However, the current main research is based on binary storage and the corresponding application of in-memory computation. In order to further increase the storage density of the device, simplify the circuit complexity, and realize application of high-efficiency in-memory computation and brain-like smart chips, it is imperative to develop a tunneling magnetoresistive device which has multiple resistance states, high performance, and low power consumption.

In the related art, a four-terminal synapse device based on the domain wall motion of SOT is described, however, its disadvantages are that: (1) the domain wall only moves when jointly driven by the magnetic field excited by the current and the spin-polarized current, which is not conducive to the integration of the device; (2) since the domain wall moves in a width direction of the device and the reference layer is only within a local region at an end of the device, there is a certain size waste in a long direction of the device, which is not conducive to the integration of the device; (3) a lack of local pinning regions in the device is not conducive to the precise control and stability of the domain wall, and it is difficult to differentiate the resistance states.

SUMMARY

In view of this, the present disclosure provides a magnetoresistive device and a method for changing a resistance state of the magnetoresistive device, which may partially solve the above problems in the prior art.

A magnetoresistive device is provided, including a top electrode, a ferromagnetic reference layer, a tunneling layer, a ferromagnetic free layer, a spin-orbit coupling layer, and a bottom electrode arranged in sequence along a preset direction; where the spin-orbit coupling layer includes a first thickness region and a second thickness region distributed alternately, and a thickness of the first thickness region is different form a thickness of the second thickness region; and the ferromagnetic free layer includes a pinning region, and a position of the pinning region is in one-to-one correspondence with a position of the first thickness region.

According to the embodiments of the present disclosure, the thickness of the first thickness region is greater than the thickness of the second thickness region.

According to the embodiments of the present disclosure, the magnetoresistive device further includes a DMI enhancement layer, where the DMI enhancement layer is located between the tunneling layer and the ferromagnetic free layer.

According to the embodiments of the present disclosure, a material of the DMI enhancement layer includes at least one of Ti, Cu, W, Ta, or Al.

According to the embodiments of the present disclosure, the ferromagnetic free layer includes N pinning regions, and the magnetoresistive device includes (N+2) resistance states.

According to the embodiments of the present disclosure, a material of the ferromagnetic reference layer includes at least one of CoFeB, CoFe, or a composite material of Co/Pt; a material of the ferromagnetic free layer (104) includes at least one of CoFeB, CoFe, or a composite material of Co/Pt; and a material of the tunneling layer (103) includes at least one of MgO or Al$_2$O$_3$.

According to the embodiments of the present disclosure, a material of the spin-orbit coupling layer (105) includes at least one of W, Ta, or Pt.

A method for changing a resistance state of the above-mentioned magnetoresistive device is provided, including: applying a modulation driving current to the magnetoresistive device, where the modulation driving current acts on the spin-orbit coupling layer (105); and changing a characteristic of the modulation driving current, so as to change the resistance state of the magnetoresistive device.

According to the embodiments of the present disclosure, the changing a characteristic of the modulation driving current includes: changing, at least one of a pulse width, a pulse amplitude, a pulse number, or a pulse direction of the modulation driving current.

A synapse learning module including the above-mentioned magnetoresistive device is provided, including:

a training unit configured to generate a writing pulse according to an arrival order of a pre-neuron signal and a post-neuron signal and a time interval between the pre-neuron signal and the post-neuron signal; and a synapse device including the magnetoresistive device; where the top electrode (101) and the bottom electrode (106) of the magnetoresistive device are connected to the training unit.

The magnetoresistive device provided by the embodiments of the present disclosure includes the spin-orbit coupling layer having a non-uniform distribution of thickness, and in the absence of an external magnetic field, a spin-orbit torque is used to efficiently drive a motion of a magnetic domain wall in the ferromagnetic free layer. Due to the non-uniform thickness of the spin-orbit coupling layer, Dzyaloshinski-Moriya interaction (DMI) with non-uniform intensity is formed between the spin-orbit coupling layer and the ferromagnetic free layer. A plurality of pinning regions in one-to-one correspondence with the positions of the first thickness regions are formed in the ferromagnetic free layer under the non-uniform distribution of Dzyaloshinski-Moriya interaction. Under the drive of the modulation driving current, the motion and pinning of the domain wall are realized, which facilitates the formation of a relatively stable resistance state, and the performance of the magnetoresistive device is more stable. Moreover, the magnetoresistive device provided by the embodiments of the present disclosure utilizes the spin-orbit torque to efficiently drive the motion of the magnetic domain wall in the ferromagnetic free layer without an external magnetic field. The domain wall is pinned in the set pinning region through Dzyaloshinski-Moriya interaction, and DMI helps to increase the velocity at which the domain wall moves. Compared with the prior art, a large current is not required to generate enough torque to reverse the free layer during a writing process, thereby reducing the writing energy consumption. In addition, in the magnetoresistive device provided by the embodiments of the present disclosure, in the absence of an external magnetic field, the domain wall is driven to move only by the modulation driving current, and does not need to be jointly driven by the magnetic field excited by the current and the spin-polarized current, which facilitates the integration and compatibility of the device. In view of above, the magnetoresistive device provided by the embodiments of the present disclosure realizes the differentiation of multi-resistance states, and has lower power consumption, higher device speed, higher reliability, and circuit compatibility.

The magnetoresistive device provided by the embodiments of the present disclosure may be combined with a peripheral storage circuit to implement a multi-value storage array and improve the density of data storage. The magnetoresistive device may also be used in a neuromorphic synapse device and a logic operation device (Half Adder, Full Adder, AND, NAND, OR, NOR, XOR, XNOR), to further realize in-memory computation.

BRIEF DESCRIPTION OF THE DRAWINGS

FIG. 1b shows a schematic structural diagram of a spin-orbit coupling layer and a ferromagnetic free layer of the magnetoresistive device shown in FIG. 1a;

FIG. 2b shows a schematic structural diagram of a spin-orbit coupling layer and a ferromagnetic free layer, in the magnetoresistive device shown in FIG. 2a;

DESCRIPTION OF REFERENCE NUMERALS

101, top electrode; 102, ferromagnetic reference layer; 103, tunneling layer; 104, ferromagnetic free layer; 105, spin-orbit coupling layer; 1051, first thickness region; 1052, second thickness region; 106, bottom electrode; 107, DMI enhancement layer; 201, domain wall; 202, pinning region; 2021, first pinning region; and 2022, second pinning region.

DETAILED DESCRIPTION OF EMBODIMENTS

The embodiments of the present disclosure will be further described below with reference to the drawings.

Figure 1A:
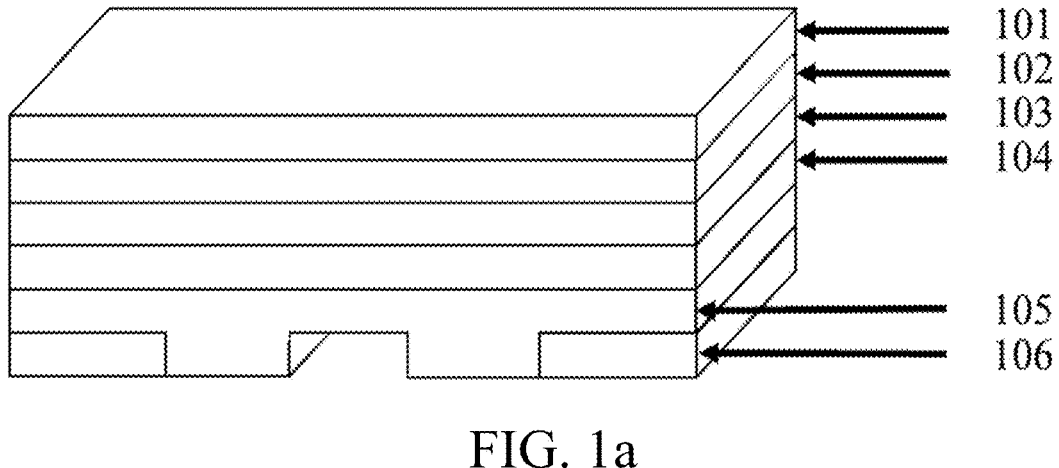
FIG. 1a shows a schematic structural diagram of a magnetoresistive device provided by an embodiment of the present disclosure.

FIG. 1a shows a schematic structural diagram of a magnetoresistive device provided by an embodiment of the present disclosure.

As shown in FIG. 1a, according to the embodiments of the present disclosure, a magnetoresistive device is provided, including a top electrode 101, a ferromagnetic reference layer 102, a tunneling layer 103, a ferromagnetic free layer 104, a spin-orbit coupling layer 105, and a bottom electrode 106 that are arranged in sequence along a preset direction. The spin-orbit coupling layer 105 includes first thickness regions 1051 and second thickness regions 1052 distributed alternately, and a thickness of the first thickness region 1051 is different form a thickness of the second thickness region 1052. The ferromagnetic free layer 104 includes pinning regions 202, and positions of the pinning regions 202 are in one-to-one correspondence with positions of the first thickness regions 1051.

Figure 1B:
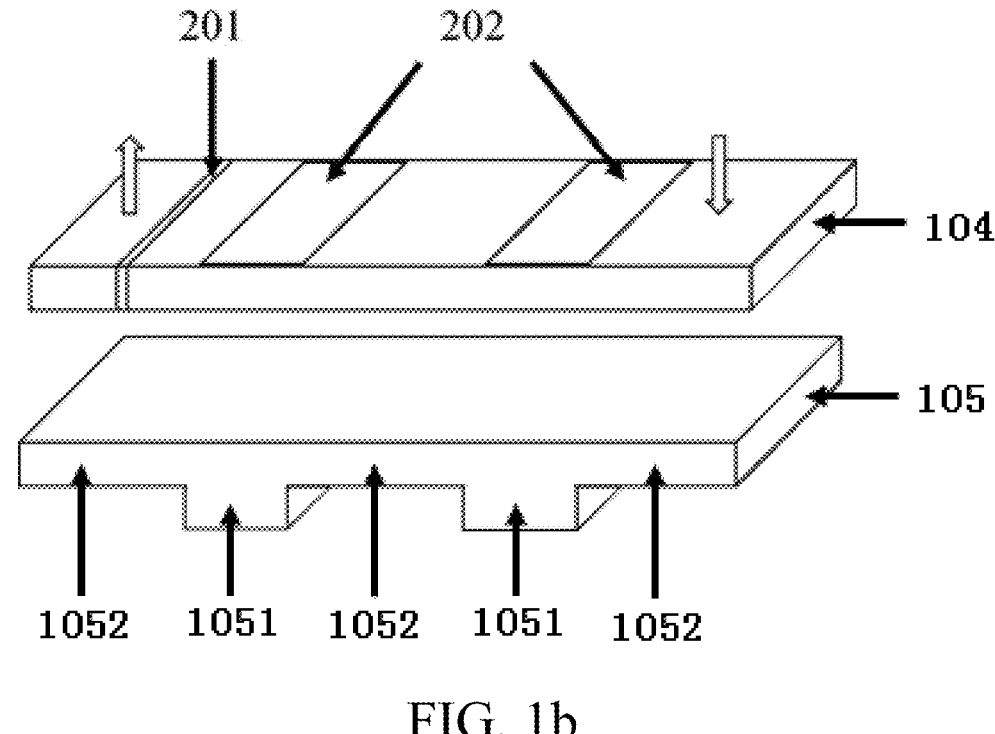

FIG. 1b shows a schematic structural diagram of a spin-orbit coupling layer 105 and a ferromagnetic free layer 104 of the magnetoresistive device as shown in FIG. 1a. Optionally, according to an embodiment of the present disclosure, the thickness of the first thickness region 1051 is greater than the thickness of the second thickness region 1052. In general, the larger a thickness of a part of the spin-orbit coupling layer 105, the greater the DMI of this part. Accordingly, a pinning region 202 is prone to be formed at a corresponding position in the spin-orbit coupling layer 105, so that a domain wall 201 may be stabilized therein. Therefore, the positions of the pinning regions 202 are in one-to-one correspondence with the positions of the first thickness regions 1051 that have larger thicknesses.

According to the magnetoresistive device provided by the embodiments of the present disclosure, the domain wall 201 is injected via a notch, a diamond-shaped region, or a region with low perpendicular magnetic anisotropy at a starting position in the ferromagnetic free layer 104. The magnetoresistive device provided by the embodiments of the present disclosure includes the spin-orbit coupling layer 105 with a non-uniform distribution of thickness. Specifically, the thickness of the spin-orbit coupling layer 105 may be modulated through a deposition process and/or an etching process.

In the absence of an external magnetic field, a spin-orbit torque is used to efficiently drive a motion of the magnetic domain wall 201 in the ferromagnetic free layer 104. Due to the non-uniform thickness of the spin-orbit coupling layer 105, Dzyaloshinski-Moriya interaction (i.e., DMI) with non-uniform intensity is formed between the spin-orbit coupling layer 105 and the ferromagnetic free layer 104. In the presence of a drive of a modulation driving current, DMI has a promoting effect on the motion of the domain wall 201, that is, the potential barrier of the domain wall 201 is reduced. Under the non-uniform distribution of Dzyaloshinski-Moriya interaction (DMI), potential barriers and potential wells are alternately distributed according to the intensity difference of DMI. A place where a potential well is located is a pinning region 202, which may effectively stabilize the domain wall 201 therein, that is, a plurality of pinning regions 202 that are in one-to-one correspondence with the positions of the first thickness regions 1051 are formed in the ferromagnetic free layer 104.

Under the drive of the modulation driving current, the domain wall 201 in the ferromagnetic free layer 104 may be respectively stabilized therein when moving. When the modulated driving current drives the magnetic domain wall 201 to move from an initial state to a next pinning region 202 or to a boundary of the device, the proportion of the domain area that is parallel or antiparallel to the magnetic moment of the reference layer varies accordingly. That is, different resistance states are formed in the magnetoresistive device. Since there are a plurality of stable pinning regions 202 in the magnetoresistive device, it is beneficial to the precise control of the domain wall 201 for forming stable resistance states, and the performance of the magnetoresistive device may be more stable.

Figure 3:
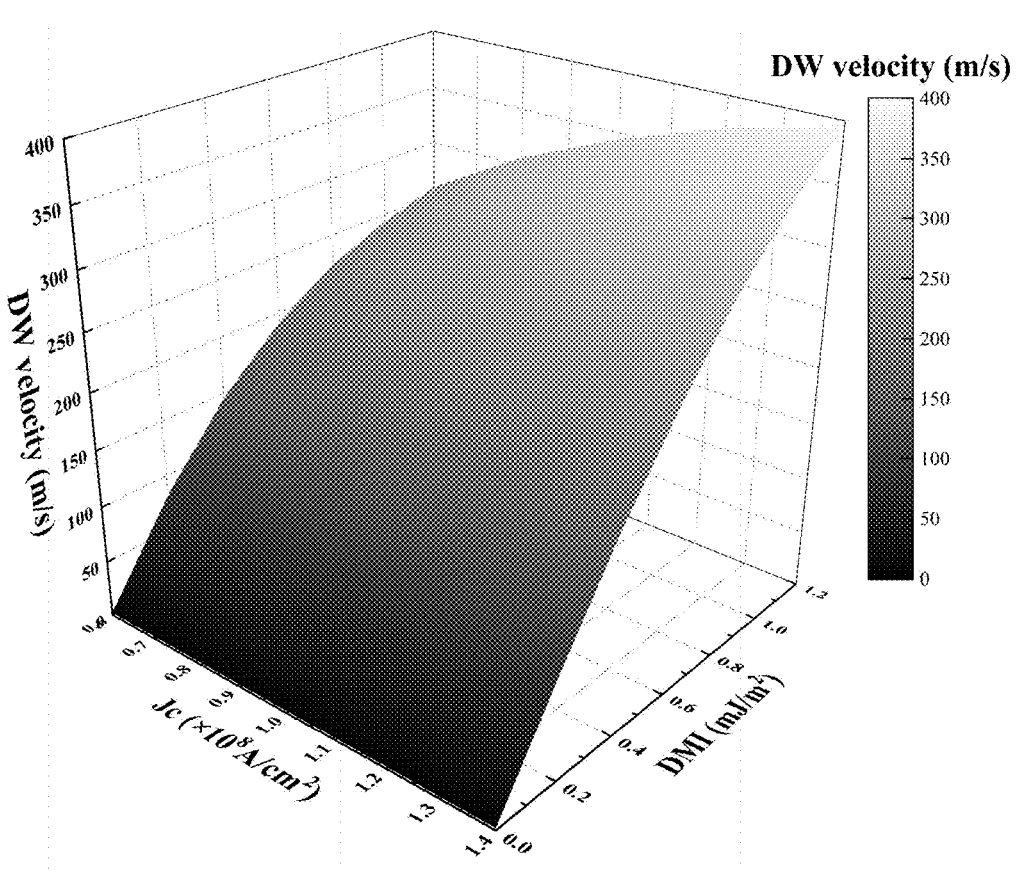
FIG. 3 shows a schematic diagram of a relationship between a velocity at which a domain wall moves, a pulse amplitude of a modulation driving current, and DMI, in a magnetoresistive device provided by an embodiment of the present disclosure.

FIG. 3 shows a schematic diagram of a relationship between a velocity at which a domain wall moves, a pulse amplitude of a modulation driving current, and DMI, in a magnetoresistive device provided by an embodiment of the present disclosure.

As shown in FIG. 3, in addition to improving a velocity at which the domain wall 201 moves by increasing a pulse amplitude of the modulation driving current, it may be seen that DMI has a significant promoting effect on the velocity at which the domain wall 201 moves. Furthermore, by modulating the DMI, not only a corresponding pinning region 202 may be formed, but also the velocity at which the domain wall 201 moves may be greatly improved, thereby realizing high-speed writing and low operation power consumption of the device.

In view of the above, the magnetoresistive device provided by the embodiments of the present disclosure utilizes the spin-orbit torque to efficiently drive the motion of the magnetic domain wall 201 in the ferromagnetic free layer 104 without an external magnetic field, and further improves the velocity at which the domain wall 201 moves through DMI. Compared with the prior art, a large current is not required to generate enough torque to reverse the free layer during the writing process, which may reduce an energy consumption during the writing process, thereby improving an operating rate of the device. By modulating DMI, the power consumption of the device may be reduced, and combinations of some commonly used current pulse widths and pulse amplitudes may achieve power consumption in the order of tens of femtojoules. By modulating a size of the device and the like in combination with a use of a heavy metal material having a larger spin Hall angle as the spin-orbit coupling layer 105, the pulse amplitude of the current may be reduced, the pulse width of the current may be reduced, the current having a smaller amplitude pulse or a shorter pulse width may be applied, and power consumption equivalent to that of a human brain neuron may be achieved.

In addition, in the magnetoresistive device provided by the embodiments of the present disclosure, in the absence of an external magnetic field, the motion of the domain wall 201 is driven only by the modulation driving current, and does not need to be jointly driven by a magnetic field excited by a current and a spin-polarized current, which facilitates the integration of the device.

Optionally, the magnetoresistive device and a size of each layer therein may be scaled down according to the process, and a shape of the magnetoresistive device may be simply replaced by a cube or the like.

In the magnetoresistive device provided by the embodiments of the present disclosure, a plurality of alternately distributed first thickness regions 1051 and second thickness regions 1052 may be formed by depositing and/or etching the spin-orbit coupling layer 105, so as to form a plurality of groove-like (or protruding) structures on a surface of a side of the spin-orbit coupling layer 105. Optionally, a shape of the groove-like (or protruding) structure includes, but is not limited to, a rectangular groove, an arc, a triangle, and the like.

Figure 2A:
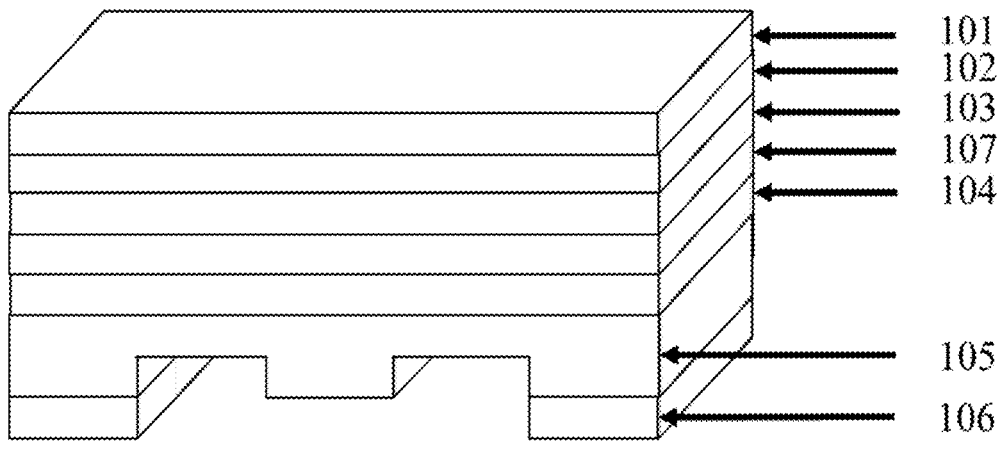
FIG. 2a shows a schematic structural diagram of a magnetoresistive device provided by another embodiment of the present disclosure.
Figure 2B:
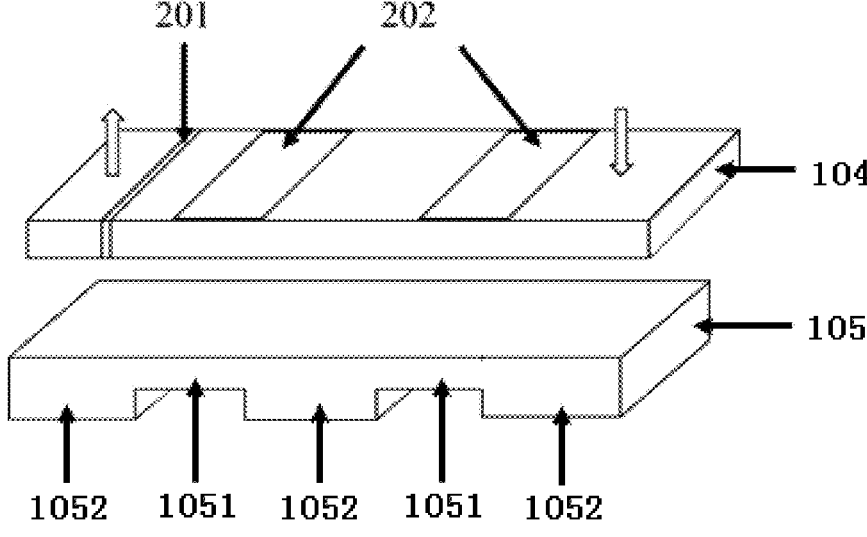

FIG. 2a shows a schematic structural diagram of a magnetoresistive device provided by another embodiment of the present disclosure; and FIG. 2b shows a schematic structural diagram of a spin-orbit coupling layer and a ferromagnetic free layer, in the magnetoresistive device shown in FIG. 2a. The magnetoresistive device as shown in FIG. 2a is different from the magnetoresistive device provided in the embodiment of FIG. 1a in that the magnetoresistive device as shown in FIG. 2a further includes a DMI enhancement layer 107 located between the tunneling layer 103 and the ferromagnetic free layer 104, and the thickness of the first thickness region 1051 is larger or smaller than the thickness of the second thickness region 1052 (FIGS. 2a and 2b show the case where the thickness of the first thickness region 1051 is smaller than the thickness of the second thickness region 1052, and the case where the thickness of the first thickness region 1051 is greater than the thickness of the second thickness region 1052 is not shown). According to the embodiments of the present disclosure, a heavy metal material may be used as the material of the DMI enhancement layer 107 and may include at least one of Ti, Cu, W, Ta, or Al.

In this embodiment, considering that a modulation range of DMI at an interface between the spin-orbit coupling layer 105 and the ferromagnetic free layer 104 is small, the DMI enhancement layer 107 (i.e., a heavy metal layer) is inserted between the ferromagnetic free layer 104 and the tunneling layer 103, where a large DMI may be generated at an interface between the DMI enhancement layer 107 and the ferromagnetic free layer 104. The addition of the DMI enhancement layer 107 may greatly increase the velocity of the domain wall 201 and decrease the requirement for the modulation driving current. As shown in FIG. 3, since DMI may significantly promote the velocity at which the domain wall 201 moves, the DMI enhancement layer 107 is added to enhance the DMI, so that the writing power consumption may be further reduced and the device operating rate may be further improved.

In addition, in this embodiment, since a sign of the DMI varies according to the interface between different materials and the stacking order of different materials, etc., the distribution of the thickness of the spin-orbit coupling layer 105 is also required to be adjusted due to the addition of the DMI enhancement layer 107. Specifically, the thickness of the first thickness region 1051 is larger or smaller than the thickness of the second thickness region 1052, the positions of the pinning regions 202 are in one-to-one correspondence with the positions of the first thickness regions 1051. When the thickness of the spin-orbit coupling layer 105 is deposited and/or etched, process parameters are required to be adjusted so as to form the corresponding structures.

According to an embodiment of the present disclosure, N (N≥1) pinning regions 202 are formed in the ferromagnetic free layer 104, and the magnetoresistive device may achieve (N+2) resistance states. Specifically, the thickness of the spin-orbit coupling layer 105 is modulated by a deposition and/or etching process to form the alternately distributed first thickness regions 1051 and second thickness regions 1052. Further, low-intensity DMI and high-intensity DMI are distributed alternately in period in the ferromagnetic free layer 104, and the N (N≥1) pinning regions 202 that have the same number as the first thickness regions 1051 are formed in the ferromagnetic free layer 104. The number of the achievable resistance states of the magnetoresistive device are related to the number of pinning regions 202, and specifically, the number of achievable resistance states is (N+2). The following description will be made with reference to embodiments shown in FIG. 4a and FIG. 4b.

Figure 4A:
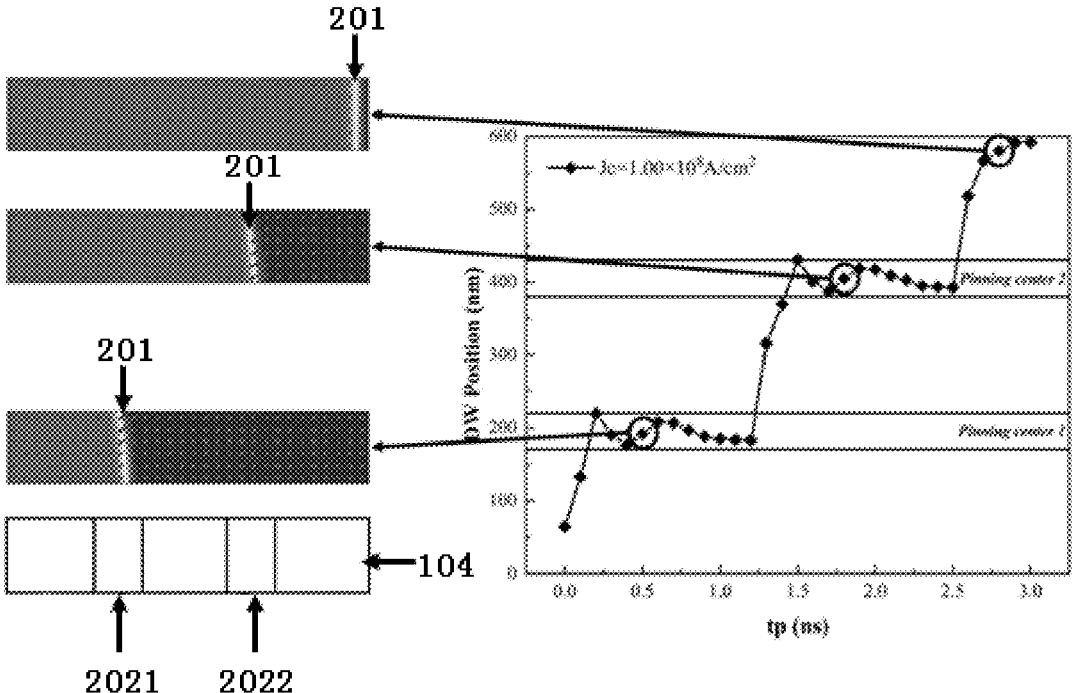
FIG. 4a shows a schematic diagram of a relationship between a position of a domain wall and a pulse width of a modulation driving current, in a magnetoresistive device provided by an embodiment of the present disclosure, and also shows a corresponding magnetic domain states diagram.

FIG. 4a shows a schematic diagram of a relationship between a position of a domain wall and a pulse width of a modulation driving current, in a magnetoresistive device provided by an embodiment of the present disclosure, and also shows a diagram of corresponding magnetic domain states.

The magnetoresistive device has a length of 600 nm and a width of 120 nm, and includes two pinning regions 202 in the ferromagnetic free layer 104, which may achieve (2+2) resistance states. Corresponding magnetic domain distributions and positions of the domain wall 201 are shown in FIG. 4a. A first pinning region 2021 is in a range of 170 nm to 220 nm, a second pinning region 2022 is in a range of 380 nm to 430 nm, and a density of the pulse of the applied modulation driving current is $(1\times10^8)$ A/cm². Different motions of the domain wall 201 and stable states of the domain wall 201 may be achieved by adjusting the pulse width of the modulated driving current.

When the modulated driving current pulse is not applied, the domain wall 201 stays at an initial position, corresponding to a first resistance state; when the pulse width of the modulation driving current pulse is increased to 0.2 ns to 1.2 ns, the modulation driving current may drive the domain wall 201 to move to the first pinning region 2021 and maintain the domain wall 201 stable, corresponding to a second resistance state; when the pulse width of the modulation driving current pulse is increased to 1.5 ns to 2.5 ns, the modulation driving current pulse may drive the domain wall 201 to get out of the first pinning region 2021, and to move to the second pinning region 2022 and maintain the domain wall 201 stable, corresponding to a third resistance state; when the pulse width of the modulation driving current pulse is increased to 2.7 ns to 3.0 ns, the domain wall 201 gets out of the second pinning region 2022 again, and moves to the edge of the device, realizing a fourth resistance state. It should be noted that in a case of an intermediate pulse width not mentioned above, a transformation to a next resistance state may still be realized under a slightly longer relaxation time. For example, in a case where the pulse width is 1.3 ns, the domain wall may still move to the second pinning region 2022 under a slightly longer relaxation time.

Figure 4B:
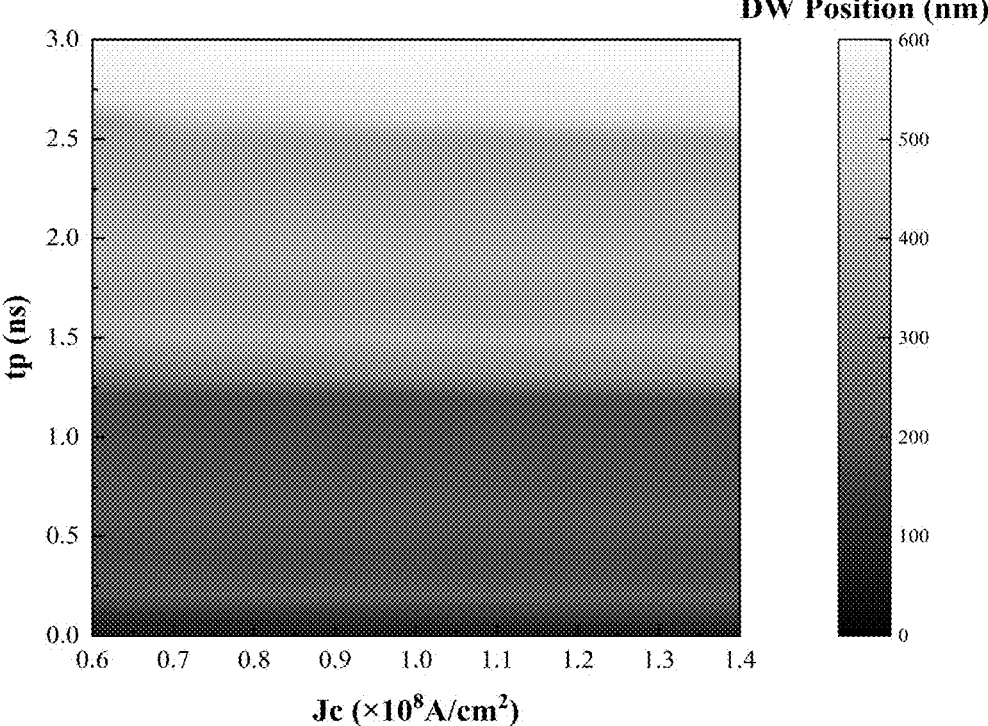
FIG. 4b shows a phase diagram of a relationship between a position of a domain wall and a pulse amplitude and pulse width of the modulation driving current, in a magnetoresistive device provided by an embodiment of the present disclosure.

FIG. 4b shows a phase diagram of a relationship between a motion of a domain wall and a pulse amplitude and pulse width of the modulation driving current, in the magnetoresistive device provided by the embodiment of FIG. 4a. In a case where the pulse amplitude of the modulation driving current is $(0.6\times10^8)$ A/cm² to $(1.4\times10^8)$ A/cm², when the modulation driving current pulse is not applied, the domain wall 201 stays at the initial position (the darkest region in the figure); when the pulse width is 0.2 ns to 1.2 ns, the modulation driving current pulse may drive the domain wall 201 to move to the first pinning region 2021 (a darker region in the figure) and maintain the domain wall 201 stable; when the pulse width is 1.2 ns to 2.5 ns, the modulation driving current pulse may drive the domain wall 201 to move to the second pinning region 2022 (a light-colored region in the figure) and maintain the domain wall 201 stable; when the pulse width is 2.5 ns to 3.0 ns, the modulation driving current pulse may drive the domain wall 201 to get out of the second pinning region 2022 (the lightest region in the figure). In addition, it may be seen from FIG. 4b that the motion of the domain wall 201 and the switching of pinning region 202 are less related to the pulse amplitude of the modulated driving current, but are more closely related to the pulse width, and they have strong time dependence.

According to an embodiment of the present disclosure, a material of the ferromagnetic reference layer 102 includes at least one of CoFeB, CoFe, or a composite material of Co/Pt; a material of the ferromagnetic free layer 104 includes at least one of CoFeB, CoFe, or a composite material of Co/Pt; and a material of the tunneling layer 103 includes at least one of MgO or $Al_2O_3$.

According to an embodiment of the present disclosure, a material of the spin-orbit coupling layer 105 includes at least one of W, Ta, or Pt.

For the magnetoresistive device provided by the embodiments of the present disclosure, an embodiment of the present disclosure further provides a method for changing a resistance state of the above-mentioned magnetoresistive device, including: applying a modulation driving current to the magnetoresistive device, where the modulation driving current acts on the spin-orbit coupling layer 105; and changing a characteristic of the modulation driving current, so as to change the resistance state of the magnetoresistive device. Specifically, according to an embodiment of the present disclosure, changing the characteristic of the modulation driving current includes changing at least one of a pulse width, a pulse amplitude, a pulse number, or a pulse direction of the modulation driving current.

Specifically, according to the above analysis in the embodiments shown in FIG. 4a and FIG. 4b, it will be seen that by changing the pulse width of the modulation driving current pulse, the domain wall 201 may be stabilized or pass through different pinning regions 202, thereby realizing a plurality of resistance states (when driven by the modulation driving current, the domain wall 201 in the ferromagnetic free layer 104 may be stabilized therein when moving, and when the modulation driving current drives the magnetic domain wall 201 to move from an initial state to a next pinning region 202 or a boundary of the device, the proportion of the domain area that is parallel or antiparallel to the magnetic moment of the reference layer varies accordingly. That is, different resistance states are formed in the tunnel junction device).

The switching of the resistance state may also be performed by changing the number of the pulse of the modulation driving current. For example, one pulse may be used for the switching of one resistance state, and two pulses may be used for the switching of two resistance states.

It will be seen from FIG. 3 that the velocity at which the domain wall 201 moves may be increased by increasing the pulse amplitude of the modulation driving current, and then the resistance state may be switched by the motion of the domain wall 201.

Figure 5:
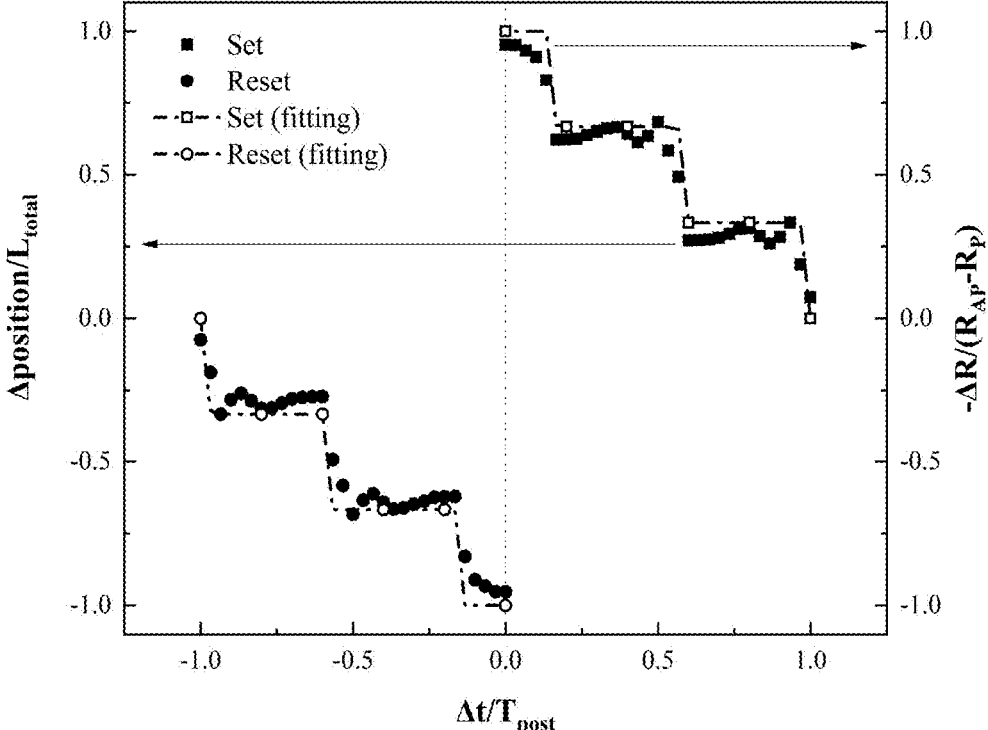
FIG. 5 shows a characteristic curve diagram of spike timing-dependent plasticity (STDP) of a magnetoresistive device provided by an embodiment of the present disclosure.

FIG. 5 shows a characteristic curve diagram of spike timing-dependent plasticity (STDP) of a magnetoresistive device provided by an embodiment of the present disclosure. The curves formed by dot-line in the figure represent resistance change curves of a set process and a reset process that are fitted to the simulated data of the magnetoresistive device. The magnetoresistive device is simulated as a synapse device, and two input spike signals represent a pre-neuron signal and a post-neuron signal, respectively. In this embodiment, the pulse amplitude of the modulation driving current is $1 \times 10^8$ A/cm$^2$. It will be seen from the figure that when the pre-neuron signal is earlier than the post-neuron signal, that is, there is $\Delta t > 0$, a forward writing pulse is generated and a weight of a synapse is increased, which means the resistance of the device is reduced; conversely, when the pre-neuron signal is later than the post-neuron signal, that is, there is $\Delta t < 0$, a reverse writing pulse is generated and the weight of the synapse is reduced, which means the resistance of the device is increased. It may be seen from FIG. 5 that the resistance state of the magnetoresistive device may be changed by changing a pulse direction of the modulation driving current.

In addition, by adjusting the size of the device and magnetic characteristic parameters of the ferromagnetic free layer 104, the changing of the resistance state of the device and the optimal modulation of the writing rate and power consumption of the device may also be achieved.

It will also be seen from FIG. 5 that the changing of the resistance state of the magnetoresistive device has strong time dependence. Specifically, when there is $\Delta t > 0$, the forward writing pulse is generated, the weight of the synapse is increased, the resistance of the device is reduced, and the on-current is increased; conversely, when there is $\Delta t < 0$, the reverse writing pulse is generated and the weight of the synapse is reduced, that is, the resistance of the device is increased and the on-current is reduced. In addition, the shorter a time interval between the pre-neuron signal and the post-neuron signal, the greater a change in the weight of the synaptic (i.e., resistance), and in a case where the time interval between the pre-neuron signal and the post-neuron signal is greater than 3 ns, the weight of the synaptic is not rewritten. It will be seen that the change of the resistance state of the magnetoresistive device has strong time dependence. Based on the time dependence, the magnetoresistive device may be applied to high-density storage, in-memory computation, and a brain-like intelligent neural synapse device.

Accordingly, the embodiments of the present disclosure further provide a synapse learning module including the above-mentioned magnetoresistive device.

Figure 6:
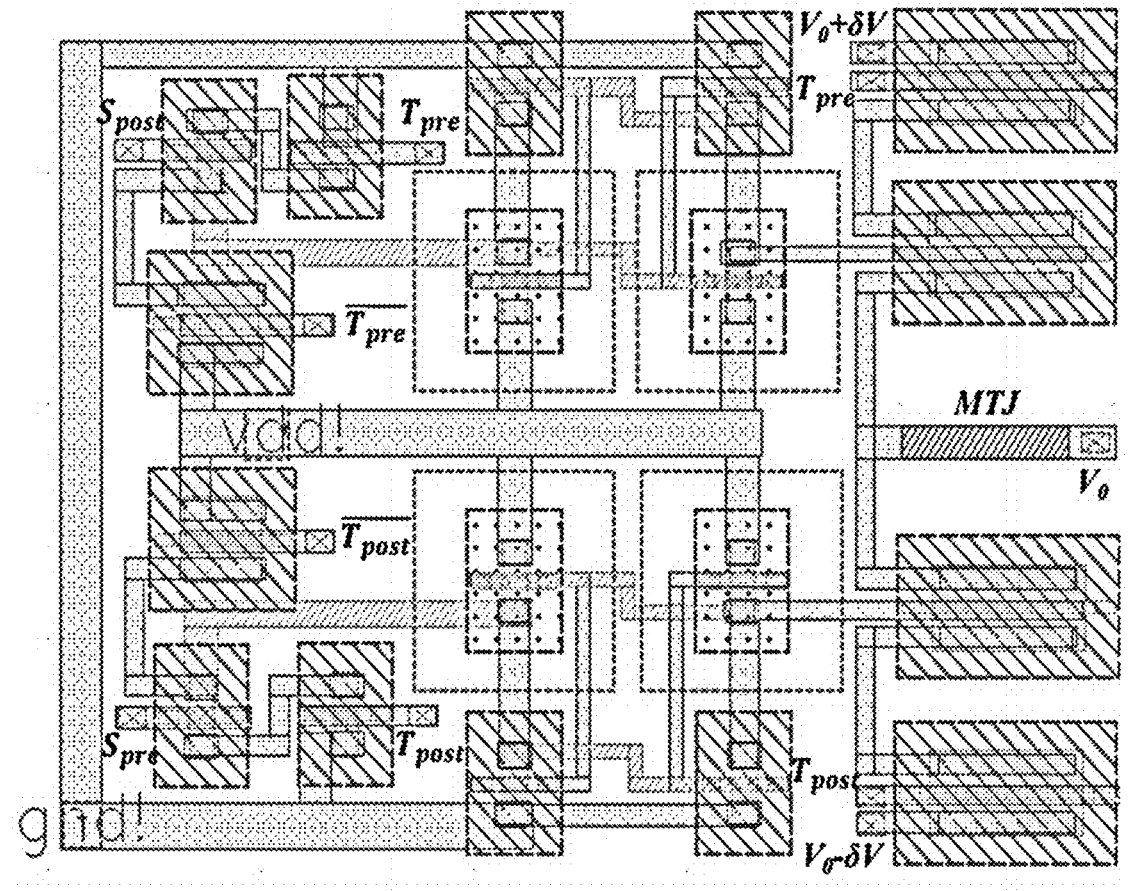
FIG. 6 shows a layout of a synapse learning module constructed based on a STDP characteristic of a magnetoresistive device provided by an embodiment of the present disclosure.
Figure 7:
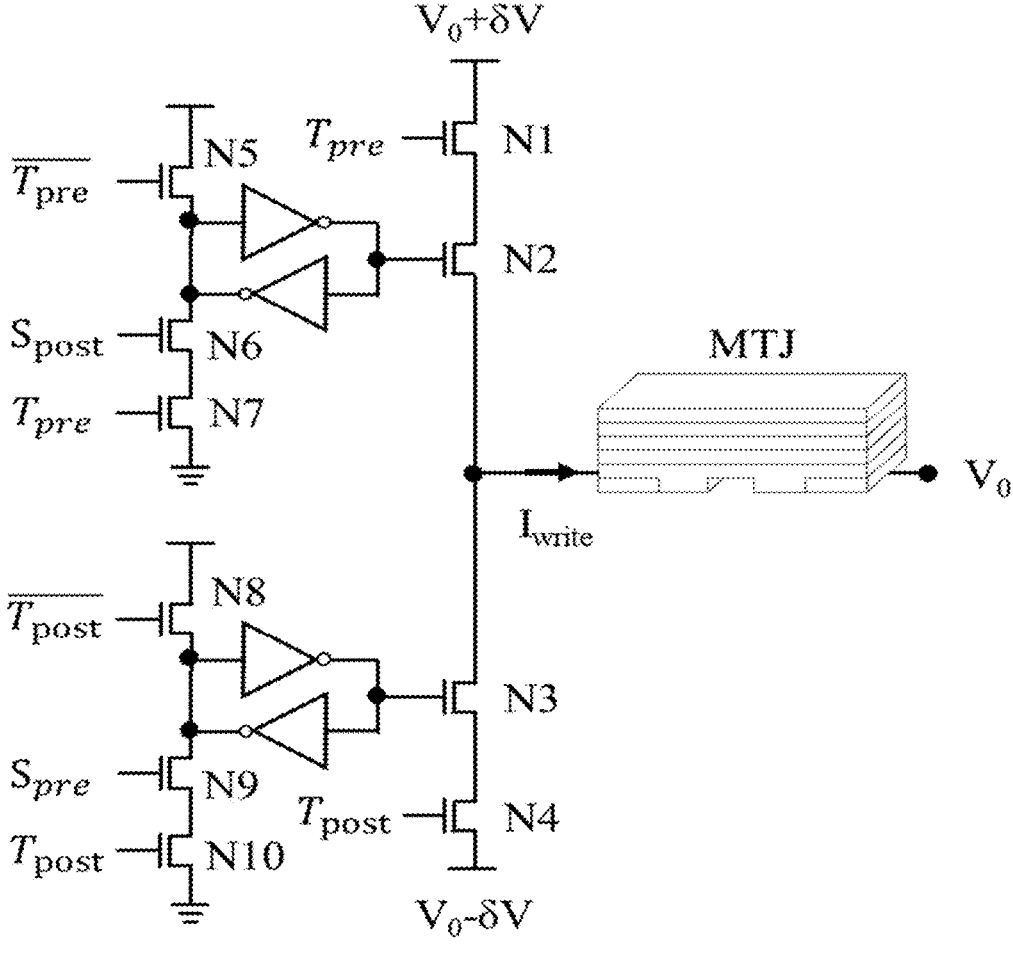
FIG. 7 shows a circuit diagram of a synapse learning module constructed based on a STDP characteristic of a magnetoresistive device provided by an embodiment of the present disclosure.
Figure 8:
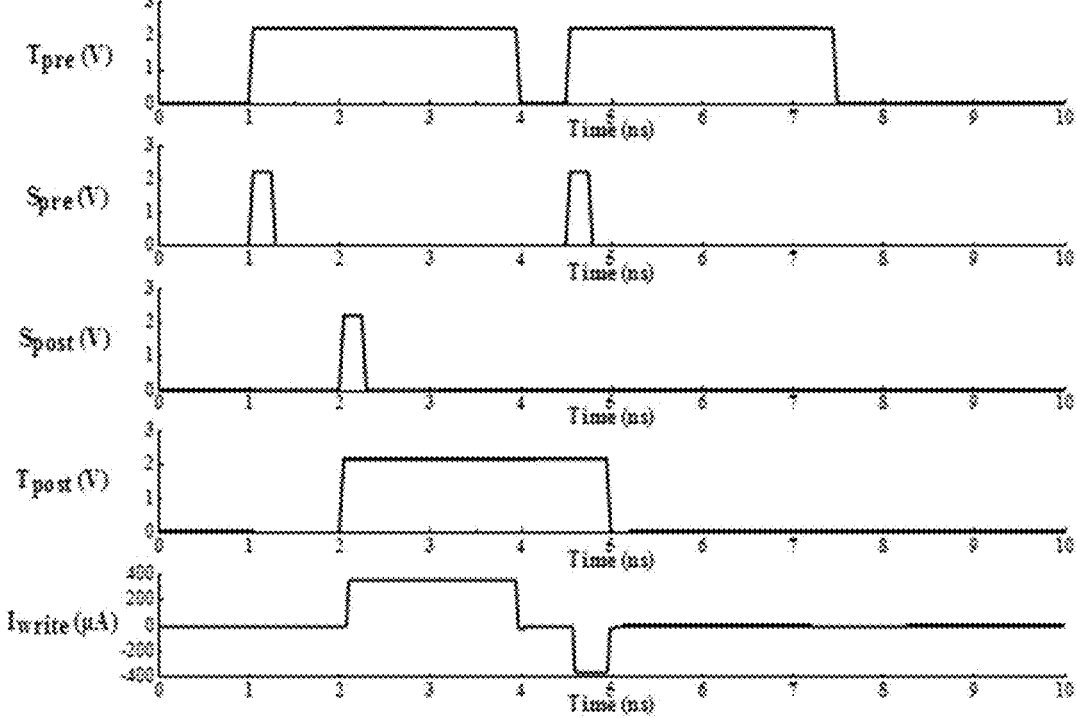
FIG. 8 shows a timing diagram of respective pulses in a synapse learning module constructed based on a STDP characteristic of a magnetoresistive device provided by an embodiment of the present disclosure.

FIG. 6 shows a layout of a synapse learning module constructed based on a STDP characteristic of a magnetoresistive device provided by an embodiment of the present disclosure; FIG. 7 shows a circuit diagram of a synapse learning module constructed based on a STDP characteristic of a magnetoresistive device provided by an embodiment of the present disclosure; and FIG. 8 shows a timing diagram of respective pulses in a synapse learning module constructed based on a STDP characteristic of a magnetoresistive device provided by the embodiments of the present disclosure. In FIGS. 6 to 8, MTJ represents the magnetoresistive device provided by the embodiments of the present disclosure, $S_{pre}$ represents a pre-neuron signal, $S_{post}$ represents a post-neuron signal, $T_{pre}$ represents a square wave signal triggered by $S_{pre}$, which is named as a pre-neuron triggering signal; $T_{post}$ represents a square wave signal triggered by $S_{post}$, which is named as a post-neuron triggering signal; and $I_{write}$ represents a writing current for the magnetoresistive device. In FIGS. 7, N1 to N10 adopt NMOS transistors.

As shown in FIGS. 6 to 7, the synapse learning module provided by the embodiments of the present disclosure includes a training unit and a synapse device. The training unit is configured to generate a writing pulse (a writing current for the synapse device) according to an arrival order of a pre-neuron signal and a post-neuron signal, and a time interval between the pre-neuron signal and the post-neuron signal. The synapse device includes the magnetoresistive device provided by the embodiments of the present disclosure, where the top electrode and the bottom electrode of the magnetoresistive device are connected to the training unit.

According to the synapse learning module provided by the embodiments of the present disclosure, based on the STDP characteristic curve of the magnetoresistive device in FIG. 5, a weight of the synapse device is rewritten according to the arrival sequence of the pre-neuron signal and the post-neuron signal and the time interval of the pre-neuron signal and the post-neuron signal, so that the energy-efficient learning function of the neural network is achieved.

The simulation learning process of the synapse device will be described below with reference to FIG. 7 and FIG. 8.

The simulation in the embodiments of the present disclosure is performed based on the 55-nm process node, and the pulse amplitude of the modulation driving current is $1 \times 10^8$ A/cm$^2$. In a case where $S_{pre}$ arrives first, N9 is turned on. At this time, since there is no $T_{post}$ signal, a lower branch latch maintains a state of left "1" and right "0", N3 is turned off, $S_{pre}$ triggers a pulse $T_{pre}$ of 3 ns, and N1 and N7 are turned on. After a period of time, during the existence of the $T_{pre}$ pulse, $S_{post}$ arrives, and N6 is turned on. Since N7 is in the turned-on state at this time, an upper branch latch is stored in a state of left "0" and right "1", N2 is turned on, $S_{post}$ turns on a pulse $T_{post}$ of 3 ns, and N4 and N10 are turned on. Since there is no $S_{pre}$ signal, N3 is still in the turned-off state. At this time, an upper branch is turned on, an lower branch is disconnected, a forward writing current $I_{write}$ flows through the magnetoresistive device, and the weight of the synapse is increased.

In a case where the post neuron signal $S_{post}$ arrives first, N6 is turned on. Since there is no $T_{pre}$ signal, the upper branch latch maintains the state of left "1" and right "0", N2 is turned off, $S_{post}$ turns on a pulse $T_{post}$ of 3 ns, and N4 and N10 are turned on. After a period of time, during the existence of the $T_{post}$ pulse, a pre-neuron spike signal $S_{pre}$ arrives, and N9 is turned on. Since N10 is in the turned-on state at this time, the lower branch latch is stored in the state of left "0" and right "1", N3 is turned on, $S_{pre}$ turns on a pulse $T_{pre}$ of 3 ns, and N1 and N7 are turned on. Since there is no $S_{post}$ signal, N2 is still in the turned-off state. At this time, the lower branch is turned on, the upper branch is disconnected, the reverse writing current $I_{write}$ flows through the magnetoresistive device, and the weight of the synapse is reduced. In addition, when the $T_{pre}$ and $T_{post}$ signals are removed, that is, N5 and N8 are turned on, the latch is stored in the state of left "1" and right "0", and N2 and N3 are turned off to reset the circuit. According to the sequence and the interval of the $T_{pre}$ and $T_{post}$ signals, writing currents $I_{write}$ in different directions and having different pulse widths may be generated (the timing diagram is as shown in FIG. 8), so that the synapse device may be trained to achieve the ideal state after learning.

In addition, in an actual use process, the device parameters of the synapse learning module provided by the embodiments of the present disclosure may be adjusted as desired, so as to facilitate the generation of writing currents with different pulse widths and amplitudes to adapt to different synapse devices.

The specific embodiments of the present disclosure described above do not limit the protection scope of the present disclosure. Any other corresponding changes and modifications made according to the technical concept of the present disclosure shall be included within the protection scope of the claims of the present disclosure.

What is claimed is:

1. A magnetoresistive device, comprising a top electrode, a ferromagnetic reference layer, a tunneling layer, a ferromagnetic free layer, a spin-orbit coupling layer, and a bottom electrode that are arranged in sequence along a preset direction, wherein:

the spin-orbit coupling layer comprises a first thickness region and a second thickness region distributed alternately, and a thickness of the first thickness region is different from a thickness of the second thickness region;

the ferromagnetic free layer comprises a pinning region, and a position of the pinning region is in one-to-one correspondence with a position of the first thickness region; and the magnetoresistive device further comprises a Dzya-loshinski-Moriya interaction (DMI) enhancement layer, wherein the DMI enhancement layer is located between the tunneling layer and the ferromagnetic free layer.

2. The magnetoresistive device according to claim 1, wherein the thickness of the first thickness region is greater than the thickness of the second thickness region.

3. The magnetoresistive device according to claim 1, wherein a material of the DMI enhancement layer comprises at least one of Ti, Cu, W, Ta, or Al.

4. The magnetoresistive device of claim 1, wherein the ferromagnetic free layer comprises N pinning regions, and the magnetoresistive device comprises (N+2) resistance states.

5. The magnetoresistive device of claim 1, wherein:

a material of the ferromagnetic reference layer comprises at least one of CoFeB, CoFe, or a composite material of Co/Pt;

a material of the ferromagnetic free layer comprises at least one of CoFeB, CoFe, or a composite material of Co/Pt; and a material of the tunneling layer comprises at least one of MgO or $Al_2O_3$.

6. The magnetoresistive device according to claim 1, wherein a material of the spin-orbit coupling layer comprises at least one of W, Ta, or Pt.

7. A method for changing a resistance state of the magnetoresistive device according to claim 1, comprising:

applying a modulation driving current to the magnetoresistive device, wherein the modulation driving current acts on the spin-orbit coupling layer; and changing a characteristic of the modulation driving current, so as to change the resistance state of the magnetoresistive device.

8. The method according to claim 7, wherein the changing a characteristic of the modulation driving current comprises:

changing at least one of a pulse width, a pulse amplitude, a pulse number, or a pulse direction of the modulation driving current.

9. A synapse learning module comprising the magnetoresistive device according to claim 1, comprising:

a training unit configured to generate a writing pulse according to an arrival order of a pre-neuron signal and a post-neuron signal, and a time interval between the pre-neuron signal and the post-neuron signal; and a synapse device comprising the magnetoresistive device, wherein the top electrode and the bottom electrode of the magnetoresistive device are connected to the training unit.

* * * * *